(12) United States Patent
Numasawa et al.

(10) Patent No.: US 9,437,768 B2
(45) Date of Patent: Sep. 6, 2016

(54) PHOTOELECTRIC CONVERSION DEVICE

(75) Inventors: Yoichiro Numasawa, Tokyo (JP);
Yasushi Maeda, Kanagawa (JP);
Yoshikazu Hiura, Kanagawa (JP);
Shunpei Yamazaki, Tokyo (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 439 days.

(21) Appl. No.: 13/615,700

(22) Filed: Sep. 14, 2012

(65) Prior Publication Data
US 2013/0082344 A1 Apr. 4, 2013

(30) Foreign Application Priority Data
Sep. 30, 2011 (JP) ................. 2011-216412

(51) Int. Cl.
| | |
|---|---|
| H01L 31/044 | (2014.01) |
| H01L 31/072 | (2012.01) |
| H01L 31/0747 | (2012.01) |
| H01L 31/18 | (2006.01) |
| H01L 31/0312 | (2006.01) |

(52) U.S. Cl.
CPC ......... *H01L 31/072* (2013.01); *H01L 31/0747* (2013.01); *H01L 31/1804* (2013.01); *H01L 31/0312* (2013.01); *Y02E 10/547* (2013.01); *Y02P 70/521* (2015.11)

(58) Field of Classification Search
USPC ................................. 136/243–265
See application file for complete search history.

(56) References Cited

U.S. PATENT DOCUMENTS

| | | | |
|---|---|---|---|
| 4,581,476 A | 4/1986 | Yamazaki | |
| 5,077,223 A | 12/1991 | Yamazaki | |
| 5,213,628 A | 5/1993 | Noguchi et al. | |
| 5,935,344 A * | 8/1999 | Endo et al. | 136/255 |
| 7,164,150 B2 | 1/2007 | Terakawa et al. | |
| 7,199,303 B2 | 4/2007 | Machida et al. | |
| 7,550,665 B2 | 6/2009 | Sasaki et al. | |
| 7,906,723 B2 | 3/2011 | Korevaar et al. | |
| 8,049,101 B2 | 11/2011 | Terakawa | |

(Continued)

FOREIGN PATENT DOCUMENTS

| | | |
|---|---|---|
| AU | 2004259485 | 4/2009 |
| CN | 001422443 A | 6/2003 |
| CN | 001442909 A | 9/2003 |
| CN | 001755949 A | 4/2006 |
| CN | 102074593 A | 5/2011 |
| CN | 102110734 A | 6/2011 |
| EP | 1265297 A | 12/2002 |
| EP | 1643564 A | 4/2006 |
| EP | 1650811 A | 4/2006 |
| EP | 2113946 A | 11/2009 |
| EP | 2293341 A | 3/2011 |
| JP | 04-130671 | 5/1992 |
| JP | 10-135497 | 5/1998 |
| JP | 11-162858 A | 6/1999 |
| JP | 2009-503848 | 1/2009 |
| JP | 2011-061197 A | 3/2011 |
| WO | WO-2007/018934 | 2/2007 |

OTHER PUBLICATIONS

Chinese Office Action (Application No. 201210367394.5) Dated Nov. 4, 2015.

*Primary Examiner* — Bach Dinh
(74) *Attorney, Agent, or Firm* — Nixon Peabody LLP; Jeffrey L. Costellia

(57) ABSTRACT

A photoelectric conversion device with low resistance loss and high conversion efficiency is provided. The photoelectric conversion device includes a first silicon semiconductor layer and a second silicon semiconductor layer between a pair of electrodes. The first silicon semiconductor layer is provided over one surface of a crystalline silicon substrate having one conductivity type and has a conductivity type opposite to that of the crystalline silicon substrate, and the second silicon semiconductor layer is provided on the other surface of the crystalline silicon substrate and has a conductivity type which is the same as that of the crystalline silicon substrate. Further, the first silicon semiconductor layer and the second silicon semiconductor layer each have a carrier concentration varying in the film thickness direction.

14 Claims, 11 Drawing Sheets

(56) References Cited

U.S. PATENT DOCUMENTS

| | | |
|---|---|---|
| 8,962,978 B2 | 2/2015 | Korevaar et al. |
| 2005/0092358 A1 | 5/2005 | Machida et al. |
| 2006/0043517 A1* | 3/2006 | Sasaki et al. ............... 257/458 |
| 2006/0065297 A1 | 3/2006 | Terakawa |
| 2007/0023081 A1 | 2/2007 | Johnson et al. |
| 2007/0023082 A1 | 2/2007 | Manivannan et al. |
| 2011/0041910 A1 | 2/2011 | Shimomura et al. |
| 2011/0056544 A1 | 3/2011 | Ji et al. |
| 2011/0290309 A1* | 12/2011 | Lee ............................ 136/255 |
| 2012/0298191 A1 | 11/2012 | Yamazaki |

* cited by examiner

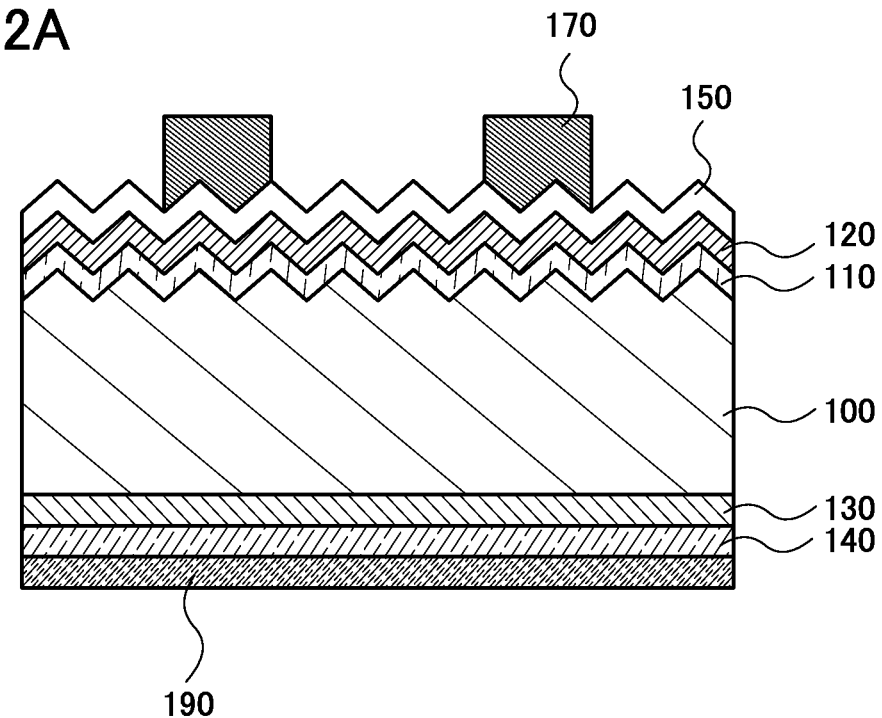
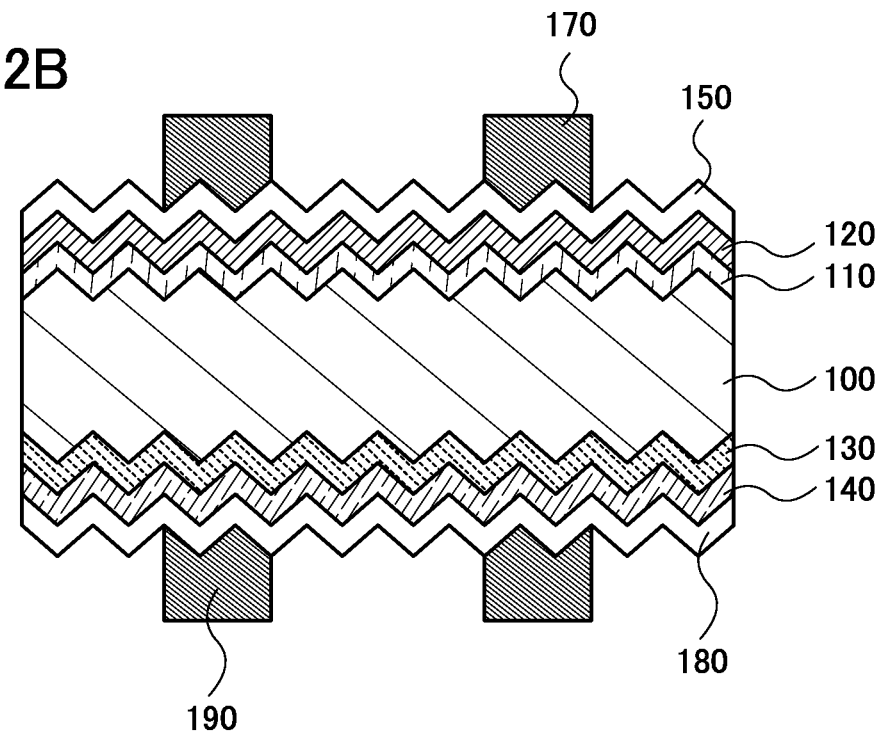

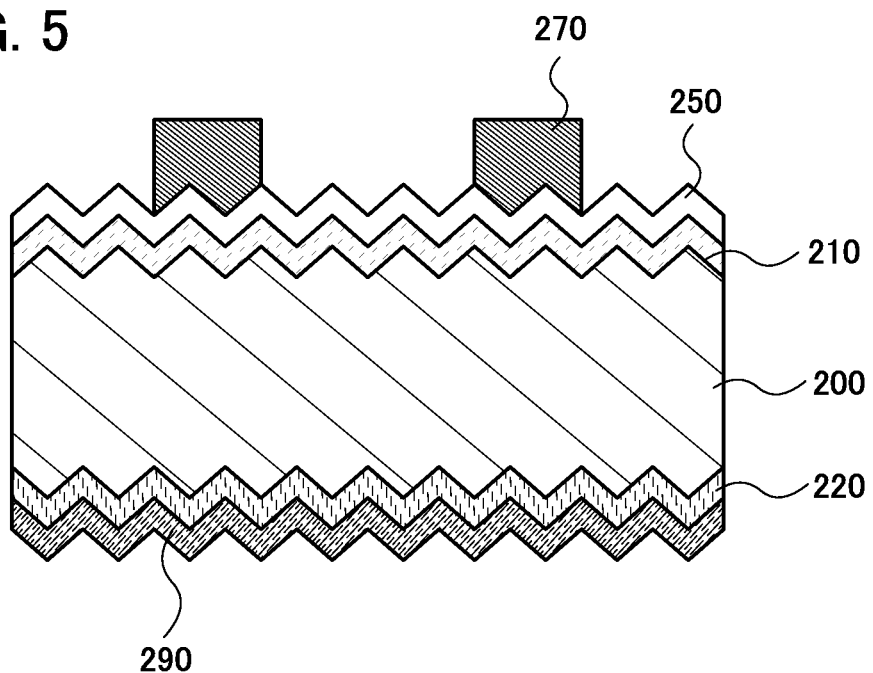

PHOTOELECTRIC CONVERSION DEVICE

BACKGROUND OF THE INVENTION

1. Field of the Invention

The present invention relates to a photoelectric conversion device.

2. Description of the Related Art

Recently, a photoelectric conversion device that generates power without carbon dioxide emissions has attracted attention as a countermeasure against global warming. As a typical example thereof, a solar cell has been known which uses a crystalline silicon substrate such as a single crystalline silicon substrate or a polycrystalline silicon substrate.

In solar cells using a crystalline silicon substrate, a structure having a so-called homo junction is widely used. In such a structure, a layer having a conductivity type opposite to that of the crystalline silicon substrate is formed on one surface side of the crystalline silicon substrate by diffusion of impurities.

Alternatively, a structure with a heterojunction in which amorphous silicon having a different optical band gap and conductivity type from those of a crystalline silicon substrate is formed on one surface side of the crystalline silicon substrate is known (see Patent Documents 1 and 2).

REFERENCE

[Patent Document 1] Japanese Published Patent Application No. H04-130671

[Patent Document 2] Japanese Published Patent Application No. H10-135497

SUMMARY OF THE INVENTION

In a solar cell having the heterojunction, a p-n junction is formed in which an i-type amorphous semiconductor layer is provided between a crystalline silicon substrate having one conductivity type and an amorphous semiconductor layer having a conductivity type opposite to that of the crystalline silicon substrate.

The provision of the i-type amorphous semiconductor layer in the p-n junction region has effects of terminating surface defects of the crystalline silicon substrate and forming a steep junction, which contributes to reduction in carrier recombination at a hetero interface.

On the other hand, in particular, an electrical conductivity of the i-type amorphous semiconductor layer is small owing to its amorphous nature, which has been a factor of resistance loss.

In view of the above, an object of one embodiment of the present invention is to provide a photoelectric conversion device with low resistance loss and high conversion efficiency.

One embodiment of the present invention disclosed in this specification is a photoelectric conversion device including a first silicon semiconductor layer and a second silicon semiconductor layer between a pair of electrodes. The first silicon semiconductor layer is provided over one surface of a crystalline silicon substrate having one conductivity type and has a conductivity type opposite to that of the crystalline silicon substrate, and the second silicon semiconductor layer is provided on the other surface of the crystalline silicon substrate and has a conductivity type which is the same as that of the crystalline silicon substrate. Further, the first silicon semiconductor layer and the second silicon semiconductor layer each have a carrier concentration varying in the film thickness direction.

One embodiment of the present invention disclosed in this specification is a photoelectric conversion device including a crystalline silicon substrate having one conductivity type; a light-transmitting conductive film; a first electrode; a second electrode; a first silicon semiconductor layer having a single-layer structure or a stacked-layer structure which is provided between the crystalline silicon substrate and the light-transmitting conductive film and has a conductivity type opposite to a conductivity type of the crystalline silicon substrate; and a second silicon semiconductor layer having a single-layer structure or a stacked-layer structure which is provided between the crystalline silicon substrate and the second electrode and has a conductivity type which is the same as the conductivity type of the crystalline silicon substrate. A carrier concentration of the first silicon semiconductor layer is lower on a crystalline silicon substrate side than on a light-transmitting conductive film side. A carrier concentration of the second silicon semiconductor layer is lower on the crystalline silicon substrate side than on a second electrode side.

Note that the ordinal numbers such as "first" and "second" in this specification, etc. are assigned in order to avoid confusion among components, but not intended to limit the number or order of the components.

The crystalline silicon substrate preferably has n-type conductivity, the first silicon semiconductor layer preferably has p-type conductivity, and the second silicon semiconductor layer preferably has n-type conductivity.

Further, a light-transmitting conductive film may be provided between the second silicon semiconductor layer and the second electrode.

One embodiment of the present invention disclosed in this specification is a photoelectric conversion device including a crystalline silicon substrate having one conductivity type; a stacked-layer including a first silicon semiconductor layer and a second silicon semiconductor layer which are provided over one surface of the crystalline silicon substrate and each have a conductivity type opposite to a conductivity type of the crystalline silicon substrate; a light-transmitting conductive film provided over the second silicon semiconductor layer; a first electrode provided over the light-transmitting conductive film; a stacked-layer including a third silicon semiconductor layer which is provided on the other surface of the crystalline silicon substrate and a fourth silicon semiconductor layer which is provided on the third silicon semiconductor layer, the third silicon semiconductor layer and the fourth silicon semiconductor layer each have a conductivity type which is the same as the conductivity type of the crystalline silicon substrate; and a second electrode provided on the four silicon semiconductor layer. The first silicon semiconductor layer has a lower carrier concentration than a carrier concentration of the second silicon semiconductor layer and the third silicon semiconductor layer has a lower carrier concentration than a carrier concentration of the fourth silicon semiconductor layer.

The crystalline silicon substrate preferably has n-type conductivity, the first silicon semiconductor layer and the second silicon semiconductor layer preferably have p-type conductivity, and the third silicon semiconductor layer and the fourth silicon semiconductor layer preferably have n-type conductivity.

Further, a light-transmitting conductive film may be provided between the fourth silicon semiconductor layer and the second electrode.

Further, the first silicon semiconductor layer preferably has a dark conductivity greater than or equal to $1\times10^{-10}$ S/cm and less than or equal to $1\times10^{-5}$ S/cm and the third silicon semiconductor layer preferably has a dark conductivity greater than or equal to $1\times10^{-9}$ S/cm and less than or equal to $1\times10^{-4}$ S/cm.

Further, one embodiment of the present invention disclosed in this specification is a photoelectric conversion device including a crystalline silicon substrate having one conductivity type; a first silicon semiconductor layer which is provided over one surface of the crystalline silicon substrate and has a conductivity type opposite to a conductivity type of the crystalline silicon substrate; a light-transmitting conductive film provided over the first silicon semiconductor layer; a first electrode provided over the light-transmitting conductive film; a second silicon semiconductor layer which is provided on the other surface of the crystalline silicon substrate and has a conductivity type which is the same as the conductivity type of the crystalline silicon substrate; and a second electrode provided on the second silicon semiconductor layer. A concentration distribution of an impurity element imparting a conductivity type in the first silicon semiconductor layer is relatively low in a vicinity of a crystalline silicon substrate side and relatively high in a vicinity of a light-transmitting conductive film side. A concentration distribution of an impurity element imparting a conductivity type in the second silicon semiconductor layer is relatively low in a vicinity of a crystalline silicon substrate side and relatively high in a vicinity of the second electrode side.

The crystalline silicon substrate preferably has n-type conductivity, the first silicon semiconductor layer preferably has p-type conductivity, and the second silicon semiconductor layer preferably has n-type conductivity.

Further, a light-transmitting conductive film may be provided between the second silicon semiconductor layer and the second electrode.

According to one embodiment of the present invention, a photoelectric conversion device whose resistance loss can be reduced and whose conversion efficiency is high can be provided.

BRIEF DESCRIPTION OF THE DRAWINGS

FIGS. 2A and 2B are cross-sectional views each illustrating a photoelectric conversion device according to one embodiment of the present invention.

FIG. 5 is a cross-sectional view illustrating a photoelectric conversion device according to one embodiment of the present invention.

DETAILED DESCRIPTION OF THE INVENTION

Figure 1:
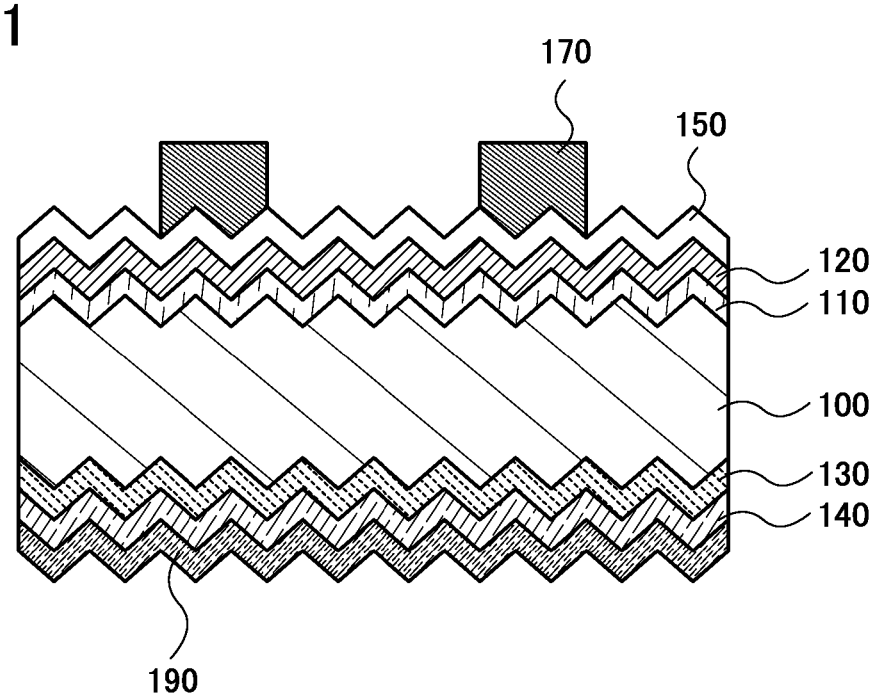
FIG. 1 is a cross-sectional view illustrating a photoelectric conversion device according to one embodiment of the present invention.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments. In the drawings for explaining the embodiments, the same portions or portions having similar functions are denoted by the same reference numerals, and description of such portions is not repeated in some cases.

(Embodiment 1)

In this embodiment, a photoelectric conversion device according to one embodiment of the present invention and a method for manufacturing the photoelectric conversion device will be described.

FIG. 1 is a cross-sectional view of a photoelectric conversion device according to one embodiment of the present invention. The photoelectric conversion device includes a crystalline silicon substrate 100 whose surfaces are processed to have unevenness and further includes, over one surface of the crystalline silicon substrate, a first silicon semiconductor layer 110, a second silicon semiconductor layer 120, a light-transmitting conductive film 150, and a first electrode 170. Furthermore, the photoelectric conversion device includes a third silicon semiconductor layer 130 provided on the other surface of the crystalline silicon substrate, a fourth silicon semiconductor layer 140 provided on the third silicon semiconductor layer 130, and a second electrode 190 provided on the fourth silicon semiconductor layer 140. Note that the first electrode 170 is a grid electrode, and a surface on the first electrode 170 side serves as a light-receiving surface.

In the structure shown in FIG. 1, light which enters through the light-receiving surface travels obliquely into the crystal silicon substrate 100 due to the unevenness on the surface; thus, the optical path length is increased and photoexcited carriers can be increased. In addition, a so-called light trapping effect in which reflected light by the back surface is totally reflected at the front surface can occur.

Note that as illustrated in FIG. 2A, a structure in which only one of surfaces (the front surface and the back surface) is processed to have unevenness may be employed. The surface area of the crystalline silicon substrate is increased by the unevenness; thus, while the optical effect described above can be obtained, the absolute amount of surface defects is increased. Therefore, in consideration of the balance between the optical effect and the amount of the surface defects, a practitioner may determine the structure so that more favorable electric characteristics can be obtained.

Alternatively, as illustrated in FIG. 2B, a structure in which the second electrode 190 is also a grid electrode and a light-transmitting conductive film 180 is provided between the fourth silicon semiconductor layer 140 and the second electrode 190 so that both sides of the structure serve as light-receiving surfaces may be employed.

A single crystal silicon substrate or a polycrystalline silicon substrate, which has one conductivity type, can be used for the crystalline silicon substrate 100. In this embodiment, a single crystal silicon substrate having n-type conductivity is used for the crystalline silicon substrate 100.

In the above structure, a p-type silicon semiconductor layer can be used for the first silicon semiconductor layer 110 and the second silicon semiconductor layer 120, which are formed over one surface of the crystalline silicon substrate 100. A silicon semiconductor layer to which an impurity imparting p-type conductivity such as boron, aluminum, or gallium and hydrogen are added can be used for the p-type silicon semiconductor layer.

Note that a silicon semiconductor layer whose carrier concentration is lower than that of the second silicon semiconductor layer 120 can be used for the first silicon semiconductor layer 110. In order to clarify such a structure, in this specification, the conductivity type of a p-type semiconductor layer having a relatively low carrier concentration such as the first silicon semiconductor layer 110 is referred to as $p^-$-type, whereas the conductivity type of a p-type semiconductor layer having a relatively high carrier concentration such as the second silicon semiconductor layer 120 is referred to as $p^+$-type.

Note that the flow rate of a dopant gas may be changed in film formation by a plasma CVD method or the like in order to adjust the carrier concentration of the semiconductor layer. As the flow rate ratio of a dopant gas (e.g., diborane or phosphine) to a source gas (e.g., monosilane) is increased, the carrier concentration can increase. Alternatively, the film formation pressure, the temperature, the power density, and the like may be changed so that an activation rate of impurities in the semiconductor layer formed is changed to adjust the carrier concentration.

Note that it is preferable that an amorphous silicon semiconductor layer where the number of localized levels attributable to impurities is as small as possible be used for the $p^-$-type silicon semiconductor layer according to one embodiment of the present invention. The amorphous silicon semiconductor layer has an electrical conductivity greater than or equal to $1\times10^{-10}$ S/cm and less than or equal to $1\times10^{-5}$ S/cm in a dark condition, preferably greater than or equal to $1\times10^{-9}$ S/cm and less than or equal to $1\times10^{-6}$ S/cm, further preferably greater than or equal to $1\times10^{-9}$ S/cm and less than or equal to $1\times10^{-7}$ S/cm.

Note that the amorphous silicon semiconductor layer having the above electrical conductivity (the dark conductivity) is an amorphous silicon semiconductor layer that is controlled to be $p^-$-type by the intentional addition of an impurity imparting p-type conductivity.

Further, it is preferable that the $p^+$-type silicon semiconductor layer according to one embodiment of the present invention have an electrical conductivity greater than $1\times10^{-5}$ S/cm in a dark condition.

In a photoelectric conversion device having a p-n junction, increasing the electric field in the p-n junction and therefore increasing a diffusion potential are one method to improve electric characteristics. In general, the diffusion potential can be increased by forming a junction with the use of a $p^+$-type semiconductor or an $n^+$-type semiconductor having a high carrier concentration; however, the highly doped impurities imparting the conductivity type in the $p^+$-type semiconductor or the $n^+$-type semiconductor increase the number of localized levels. Further, the interface levels are formed because of the increased number of localized levels, whereby carrier recombination in the vicinity of the junction portion is induced. Therefore, improvement of electric characteristics of a photoelectric conversion device cannot be expected only by increasing the carrier concentration of a bonding layer.

Further, the photoelectric conversion device according to one embodiment of the present invention has a structure in which the $p^-$-type silicon semiconductor layer where the number of localized levels attributable to impurities is as small as possible and the $p^+$-type silicon semiconductor layer that improves the diffusion potential are stacked over one surface of the crystalline silicon substrate 100. The $p^-$-type silicon semiconductor layer is a semiconductor layer containing hydrogen and few defects and can be used as a passivation layer that eliminates defects on the surface of the crystalline silicon substrate. With the structure in which such a gentle junction (n-$p^-$-$p^+$) is formed, carrier recombination affected by the interface levels can be suppressed as much as possible while the diffusion potential is increased. Accordingly, an open circuit voltage and a fill factor can be particularly improved.

Further, for the third silicon semiconductor layer 130 formed on the other surface of the crystalline silicon substrate 100 and the fourth silicon semiconductor layer 140 formed on the third silicon semiconductor layer 130, an n-type silicon semiconductor layer can be used. For the n-type silicon semiconductor layer, for example, a silicon semiconductor layer to which an impurity imparting n-type conductivity such as phosphorus, arsenic, or antimony and hydrogen are added can be used.

Note that a silicon semiconductor layer whose carrier concentration is lower than that of the fourth silicon semiconductor layer 140 can be used for the third silicon semiconductor layer 130. In order to clarify such a structure, in this specification, the conductivity type of an n-type semiconductor layer having a relatively low carrier concentration such as the third silicon semiconductor layer 130 is referred to as $n^-$-type, whereas the conductivity type of an n-type semiconductor layer having a relatively high carrier concentration such as the fourth silicon semiconductor layer 140 is referred to as $n^+$-type.

Note that it is preferable that an amorphous silicon semiconductor layer where the number of localized levels attributable to impurities is as small as possible be used for the $n^-$-type silicon semiconductor layer according to one embodiment of the present invention. The amorphous silicon semiconductor layer is a semiconductor layer containing hydrogen and few defects and can be used as a passivation layer that eliminates defects on the surface of the crystalline silicon substrate 100. The amorphous silicon semiconductor layer has an electrical conductivity greater than or equal to $1\times10^{-9}$ S/cm and less than or equal to $10^{-4}$ S/cm in a dark condition, preferably greater than or equal to $1\times10^{-8}$ S/cm and less than or equal to $1\times10^{-5}$ S, further preferably greater than or equal to $1\times10^{-8}$ S S/cm and less than or equal to $1\times10^{-6}$ /cm.

Note that the amorphous silicon semiconductor layer having the above electrical conductivity (the dark conductivity) is an amorphous silicon semiconductor layer that is controlled to be $n^-$-type by the intentional addition of an impurity imparting n-type conductivity.

Further, it is preferable that the $n^+$-type silicon semiconductor layer according to one embodiment of the present invention have an electrical conductivity greater than $1\times10^{-4}$ S/cm in a dark condition.

Further, an n-n$^+$ junction is formed between the fourth silicon semiconductor layer 140 that is an n$^+$-type silicon semiconductor layer and the crystalline silicon substrate 100 with the third silicon semiconductor layer 130 provided therebetween. In other words, the fourth silicon semiconductor layer 140 serves as a back surface field (BSF) layer. Minority carriers are repelled by the electric field of the n-n$^+$ junction toward the p-n junction side, whereby recombination of carriers in the vicinity of the second electrode 190 can be prevented.

In a conventional heterojunction solar battery, an i-type amorphous silicon semiconductor layer having high resistance is used for a region which corresponds to the first silicon semiconductor layer 110 and the third silicon semiconductor layer 130 in this embodiment; according to one embodiment of the present invention, a barrier at a junction portion can be reduced. Accordingly, a photoelectric conversion device with low resistance loss can be formed.

Note that it is clear that the resistance loss of the photoelectric conversion device according to one embodiment of the present invention can be less than that of a conventional heterojunction solar battery even when one of the first silicon semiconductor layer 110 and the third silicon semiconductor layer 130 is an i-type semiconductor layer. In this embodiment, the i-type semiconductor layer is either a high-resistance semiconductor layer to which an impurity imparting p-type or n-type conductivity is not intentionally added or a high-resistance semiconductor layer whose conductivity type is adjusted by intentional addition of an impurity imparting p-type or n-type conductivity, and is a substantially i-type semiconductor layer whose electrical conductivity (dark conductivity) is smaller than those of the p$^-$-type silicon semiconductor layer and the n$^-$-type silicon semiconductor layer described above.

For the light-transmitting conductive films 150 and 180, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene, or the like. Each of the light-transmitting conductive films is not limited to a single layer, and may be a stacked layer of different films.

Further, the first electrode 170 and the second electrode 190 can be formed using a low-resistance metal such as silver, aluminum, or copper by a sputtering method, a vacuum evaporation method, or the like. Alternatively, the first electrode 170 and the second electrode 190 may be formed using a conductive resin such as a silver paste or a copper paste by a screen printing method.

Next, a method for manufacturing the photoelectric conversion device, which is illustrated in FIG. 1, will be described with reference to FIGS. 3A to 3C and FIGS. 4A to 4C.

A single crystal silicon substrate or a polycrystalline silicon substrate, which has n-type conductivity, can be used for the crystalline silicon substrate 100 according to one embodiment of the present invention. The manufacturing method of the crystalline silicon substrate is not specifically limited. In this embodiment, a single crystal silicon substrate whose surface corresponds to the (100) plane and which is manufactured by a Magnetic Czochralski (MCZ) method is used for the crystalline silicon substrate 100.

Figure 3A:
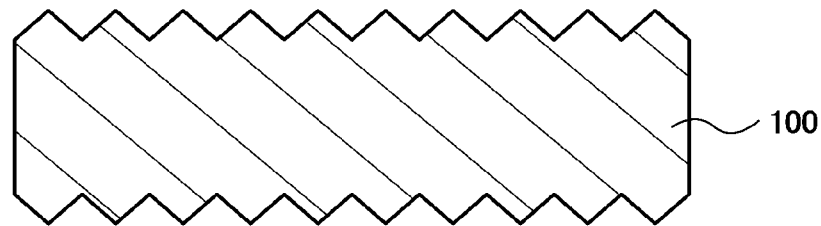
FIGS. 3A to 3C are cross-sectional views illustrating a process of a manufacturing method of a photoelectric conversion device according to one embodiment of the present invention.

Next, the front surface and the back surface of the crystalline silicon substrate 100 are subjected to a process for forming unevenness (see FIG. 3A). Note that here, an example in which the above single crystal silicon substrate having a (100) plane as a surface is used is employed to describe a method for processing the crystalline silicon substrate 100 to have unevenness. In the case where a polycrystalline silicon substrate is used as the crystalline silicon substrate 100, unevenness may be formed by a dry etching method or the like.

In the case where the initial single crystal silicon substrate is a substrate which is subjected to only a slicing process, a damage layer with a thickness of 10 μm to 20 μm, remaining on the surface of the single crystal silicon substrate, is removed by a wet etching process. For an etchant, an alkaline solution with a relatively high concentration, for example, 10% to 50% sodium hydroxide solution, or 10% to 50% pottasium hydroxide solution can be used. Alternatively, a mixed acid in which hydrofluoric acid and nitric acid are mixed, or the mixed acid to which acetic acid is further added may be used.

Next, impurities adhering to the surfaces of the single crystal silicon substrate after the removal of the damage layers are removed by acid cleaning. As an acid, for example, a mixture (FPM) of 0.5% hydrofluoric acid and 1% hydrogen peroxide, or the like can be used. Alternatively, RCA cleaning or the like may be performed. Note that this acid cleaning may be omitted.

The unevenness is formed utilizing a difference in etching rates among plane orientations in etching of the crystalline silicon using the alkaline solution. For an etchant, an alkaline solution with a relatively low concentration, for example, 1% to 5% sodium hydroxide solution, or 1% to 5% potassium hydroxide solution can be used, preferably several percent isopropyl alcohol is added thereto. The temperature of the etchant is 70° C. to 90° C., and the single crystal silicon substrate is soaked in the etchant for 30 to 60 minutes. By this treatment, unevenness including a plurality of minute projections each having a substantially square pyramidal shape and recessions formed between adjacent projections can be formed on the surfaces of the single crystal silicon substrate.

Next, oxide layers which are non-uniformly formed on the silicon surface in the etching step for forming the unevenness are removed. Another purpose of removing the oxide layers is to remove a component of the alkaline solution, which is likely to remain in the oxide layers. When an alkali metal ion, e.g., Na ion or K ion enters silicon, the lifetime is decreased, and the electric characteristics of the photoelectric conversion device are drastically lowered as a result. Note that 1% to 5% diluted hydrofluoric acid can be used to remove the oxide layers.

Next, the surfaces of the single crystal silicon substrate are preferably etched with a mixed acid in which hydrofluoric acid and nitric acid are mixed, or the mixed acid to which acetic acid is further added so that impurities such as a metal component are removed from the surfaces. By adding the acetic acid, oxidizing ability of nitric acid can be kept so as to stably perform the etching, and the etching rate can be adjusted. For example, a volume ratio of hydrofluoric acid (approximately 50%), nitride acid (60% or more) and acetic acid (90% or more) can be 1:1.5 to 3:2 to 4. Note that in this specification, the mixed acid solution containing hydrofluoric acid, nitric acid, and acetic acid is referred to as HF-nitric-acetic acid. Further, in the etching with the HF-nitric-acetic acid, angles in cross sections of vertexes of the projections are made larger, so that a surface area can be reduced, and the absolute amount of surface defects can be reduced. Note that in the case where the etching with the HF-nitric-acetic acid is performed, the above step of removing the oxide layers with diluted hydrofluoric acid can be omitted. Through the foregoing steps, the surfaces of the single crystal silicon substrate that is the crystalline silicon substrate 100 can be provided with unevenness.

Note that, in the case where unevenness is formed only on one side of the crystalline silicon substrate 100 as illustrated in FIG. 2A, a resin film having strong resistance to alkali and acid may be formed on the one side of the crystalline silicon substrate 100 before the above process for forming unevenness and the resin film may be removed after the above process for forming unevenness.

Next, after appropriate cleaning such as washing with water, the third silicon semiconductor layer 130 is formed on the back surface of the crystalline silicon substrate 100 which is a side opposite to the light-receiving surface by a plasma CVD method. The third silicon semiconductor layer 130 preferably has a thickness of greater than or equal to 3 nm and less than or equal to 50 nm. In this embodiment, the third silicon semiconductor layer 130 is n⁻-type amorphous silicon and has a thickness of 5 nm.

The third silicon semiconductor layer 130 can be formed, for example, under the following conditions: monosilane and hydrogen-based phosphine (0.5%) are introduced to a reaction chamber at a flow rate ratio of 1:0.3 to 1 (including 0.3, but not including 1); the pressure inside the reaction chamber is higher than or equal to 100 Pa and lower than or equal to 200 Pa; the distance between electrodes is greater than or equal to 10 mm and less than or equal to 40 mm; the power density based on the area of a cathode electrode is greater than or equal to 8 mW/cm² and less than or equal to 120 mW/cm²; and the substrate temperature is higher than or equal to 150° C. and lower than or equal to 300° C.

Figure 3B:
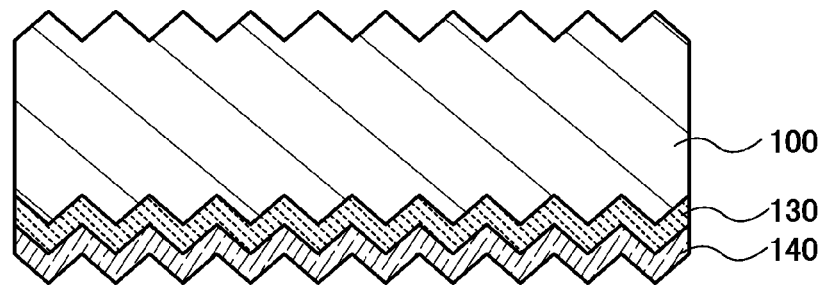

Next, the fourth silicon semiconductor layer 140 is formed on the third silicon semiconductor layer 130 (see FIG. 3B). The fourth silicon semiconductor layer 140 preferably has a thickness greater than or equal to 3 nm and less than or equal to 50 nm. In this embodiment, the fourth silicon semiconductor layer 140 is n⁺-type amorphous silicon and has a thickness of 10 nm.

The fourth silicon semiconductor layer 140 can be formed, for example, under the following conditions: monosilane and hydrogen-based phosphine (0.5%) are introduced to a reaction chamber at a flow rate ratio of 1:1 to 15; the pressure inside the reaction chamber is higher than or equal to 100 Pa and lower than or equal to 200 Pa; the distance between electrodes is greater than or equal to 10 mm and less than or equal to 40 mm; the power density based on the area of a cathode electrode is greater than or equal to 8 mW/cm² and less than or equal to 120 mW/cm²; and the substrate temperature is higher than or equal to 150° C. and lower than or equal to 300° C.

Next, the first silicon semiconductor layer 110 is formed on the surface of the crystalline silicon substrate 100 on the light-receiving surface side, by a plasma CVD method. The first silicon semiconductor layer 110 preferably has a thickness greater than or equal to 3 nm and less than or equal to 50 nm. In this embodiment, the first silicon semiconductor layer 110 is p⁻-type amorphous silicon and has a thickness of 5 nm.

The first silicon semiconductor layer 110 can be formed, for example, under the following conditions: monosilane and hydrogen-based diborane (0.1%) are introduced to a reaction chamber at a flow rate ratio of 1:0.01 to 1 (including 0.01, but not including 1); the pressure inside the reaction chamber is higher than or equal to 100 Pa and lower than or equal to 200 Pa; the distance between electrodes is greater than or equal to 10 mm and less than or equal to 40 mm; the power density based on the area of a cathode electrode is greater than or equal to 8 mW/cm² and less than or equal to 120 mW/cm²; and the substrate temperature is higher than or equal to 150° C. and lower than or equal to 300° C.

Figure 3C:
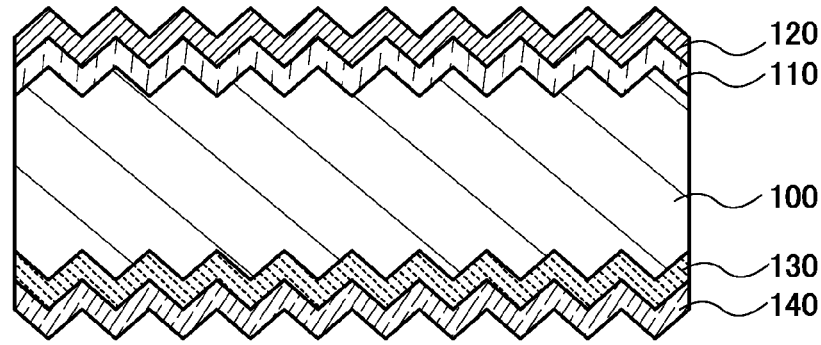

Next, the second silicon semiconductor layer 120 is formed on the first silicon semiconductor layer 110 (see FIG. 3C). The second silicon semiconductor layer 120 preferably has a thickness greater than or equal to 3 nm and less than or equal to 50 nm. In this embodiment, the second silicon semiconductor layer 120 is p⁺-type amorphous silicon and has a thickness of 10 nm.

The second silicon semiconductor layer 120 can be formed, for example, under the following conditions: monosilane and hydrogen-based diborane (0.1%) are introduced to a reaction chamber at a flow rate ratio of 1:1 to 20; the pressure inside the reaction chamber is higher than or equal to 100 Pa and lower than or equal to 200 Pa; the distance between electrodes is greater than or equal to 8 mm and less than or equal to 40 mm; the power density based on the area of a cathode electrode is greater than or equal to 8 mW/cm² and less than or equal to 50 mW/cm²; and the substrate temperature is higher than or equal to 150° C. and lower than or equal to 300° C.

Note that in this embodiment, although an RF power source with a frequency of 13.56 MHz is used as a power source in forming the first silicon semiconductor layer 110, the second silicon semiconductor layer 120, the third silicon semiconductor layer 130, and the fourth silicon semiconductor layer 140, an RF power source with a frequency of 27.12 MHz, 60 MHz, or 100 MHz may be used instead. In addition, the deposition may be carried out by not only continuous discharge but also pulse discharge. The implementation of pulse discharge can improve the film quality and reduce particles produced in the gas phase.

Note that the formation order of the films provided on the front surface and the back surface of the crystalline silicon substrate 100 is not limited to the order described above as long as the structure illustrated in FIG. 3C can be obtained. For example, the first silicon semiconductor layer 110 may be formed after the third silicon semiconductor layer 130 is formed.

Figure 4A:
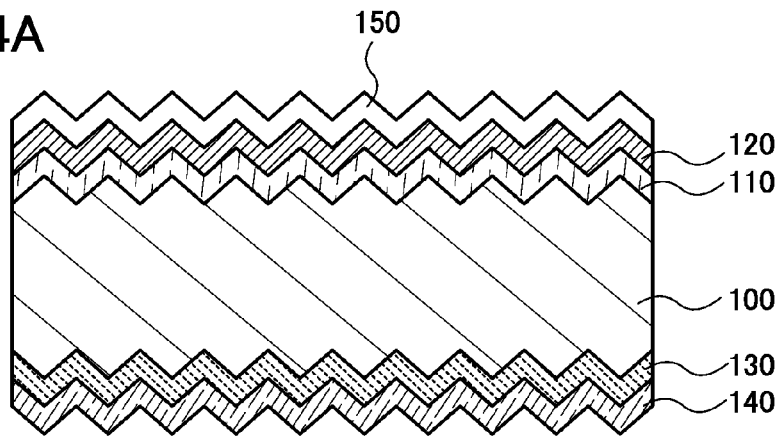
FIGS. 4A to 4C are cross-sectional views illustrating a process of a manufacturing method of a photoelectric conversion device according to one embodiment of the present invention.

Next, the light-transmitting conductive film 150 is formed on the second silicon semiconductor layer 120 (see FIG. 4A). The light-transmitting conductive film can be formed using the above material by, for example, a sputtering method. The light-transmitting conductive film preferably has a thickness greater than or equal to 10 nm and less than or equal to 1000 nm.

Figure 4B:
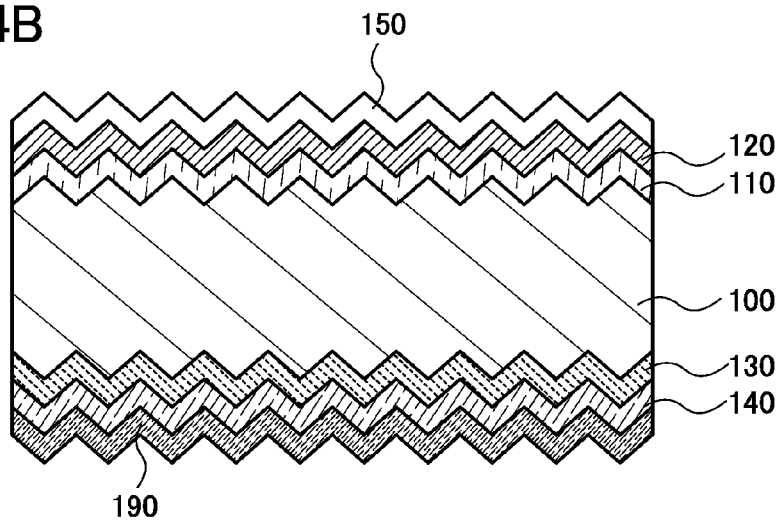

Next, the second electrode 190 is formed on the fourth silicon semiconductor layer 140 (see FIG. 4B). The second electrode 190 can be formed using a low-resistance metal such as silver, aluminum, or copper by a sputtering method, a vacuum evaporation method, or the like. Alternatively, the second electrode 190 may be formed using a conductive resin such as a silver paste or a copper paste by a screen printing method.

Figure 4C:
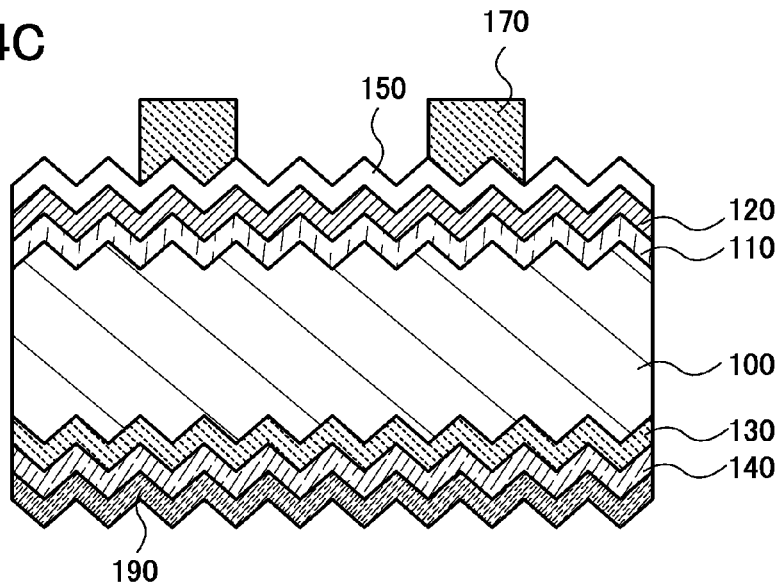

Next, the first electrode 170 is formed on the second silicon semiconductor layer 120 (see FIG. 4C). The first electrode 170 is a grid electrode, which is preferably formed using a resin including a conductor such as a silver paste, a copper paste, a nickel paste, or a molybdenum paste by a screen printing method. Further, the first electrode 170 may be a stacked layer of different materials, such as a stacked layer of a silver paste and a copper paste.

Note that in the case of forming a photoelectric conversion device of the structure illustrated in FIG. 2B, the photoelectric conversion device may be formed in such a manner that in the structure illustrated in FIG. 4A, the light-transmitting conductive film 180 is formed on the fourth silicon semiconductor layer 140 and an electrode having a shape similar to the first electrode 170 illustrated in FIG. 4C is formed on each of the light-transmitting conductive films 150 and 180.

As described above, the photoelectric conversion device with low resistance loss which is one embodiment of the present invention can be manufactured.

This embodiment can be freely combined with any of other embodiments.

(Embodiment 2)

In this embodiment, a photoelectric conversion device having a structure which is different from that described in Embodiment 1 is described. Note that detailed description of the common portions to that in Embodiment 1 is omitted in this embodiment.

FIG. 5 is a cross-sectional view of a photoelectric conversion device according to one embodiment of the present invention. The photoelectric conversion device includes a crystalline silicon substrate 200 whose surfaces are processed to have unevenness and further includes, over one surface of the crystalline silicon substrate, a first silicon semiconductor layer 210, a light-transmitting conductive film 250, and a first electrode 270. Furthermore, the photoelectric conversion device includes a second silicon semiconductor layer 220 provided on the other surface of the crystalline silicon substrate and a second electrode 290 provided on the second silicon semiconductor layer 220. Note that the first electrode 270 is a grid electrode, and the surface on which the first electrode 270 is formed serves as a light-receiving surface.

Figure 6A:
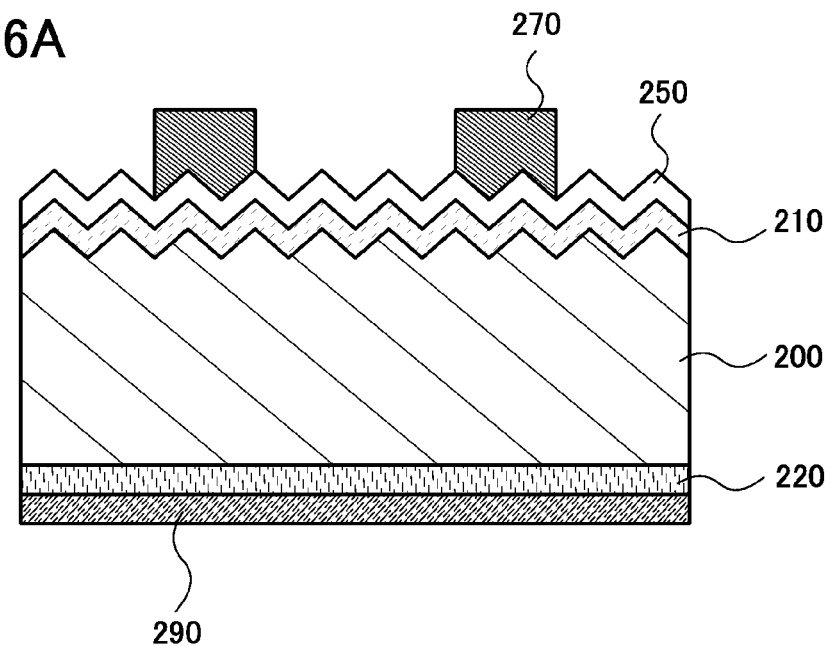
FIGS. 6A and 6B are cross-sectional views each illustrating a photoelectric conversion device according to one embodiment of the present invention.

Note that as illustrated in FIG. 6A, a structure in which only one of surfaces (the front surface and the back surface) is processed to have unevenness may be employed. The surface area of the crystalline silicon substrate is increased by the unevenness; thus, while a so-called light trapping effect can be obtained, the absolute amount of surface defects is increased. Therefore, in consideration of the balance between the optical effect and the amount of the surface defects, a practitioner may determine the structure so that more favorable electric characteristics can be obtained.

Figure 6B:
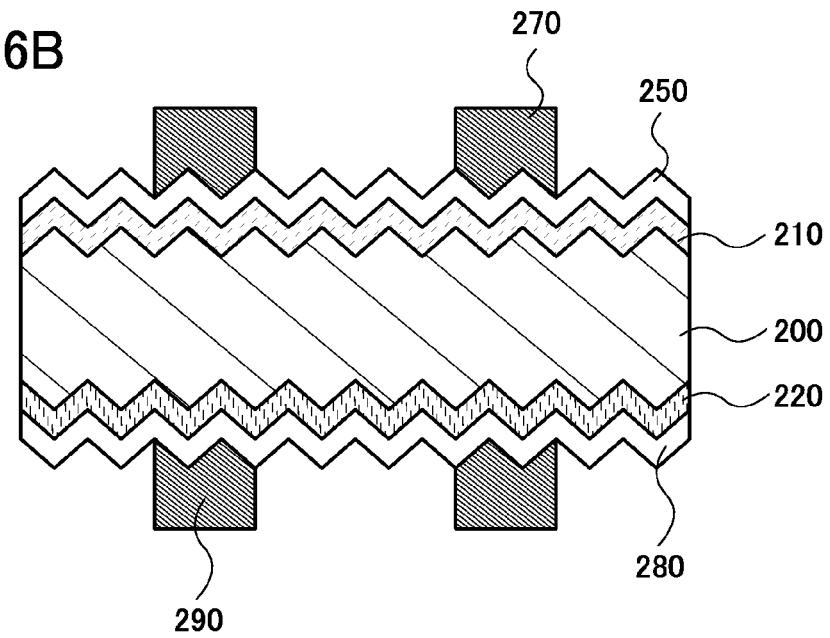

Alternatively, as illustrated in FIG. 6B, a structure in which the second electrode 290 is also a grid electrode and a light-transmitting conductive film 280 is provided between the second silicon semiconductor layer 220 and the second electrode 290 so that both sides of the structure serve as light-receiving surfaces may be employed.

The photoelectric conversion device in this embodiment differs from that of Embodiment 1 in which two semiconductor layers are stacked, in that each of the semiconductor layers formed on both surfaces of the crystalline silicon substrate 200 is a single-layer. Except for the above, the photoelectric conversion device has the same structure as that of Embodiment 1.

In this embodiment, a p-type silicon semiconductor layer can be used for the first silicon semiconductor layer 210, which is formed over one surface of the crystalline silicon substrate 200. For example, a silicon semiconductor layer to which an impurity imparting p-type conductivity such as boron, aluminum, or gallium and hydrogen are added can be used for the first silicon semiconductor layer 210.

Here, it can be said that the first silicon semiconductor layer 210 is a p-type semiconductor layer as a whole. However, the concentration profile of the impurities in the first silicon semiconductor layer 210 is changed in the film thickness direction: the first silicon semiconductor layer 210 has a concentration profile in which the impurity concentration is higher on the light-transmitting conductive film 250 side and is lower on the crystalline silicon substrate 200 side. In other words, in the first silicon semiconductor layer 210, the carrier concentration is higher on the light-transmitting conductive film 250 side and is lower on the crystalline silicon substrate 200 side.

Figure 7A:
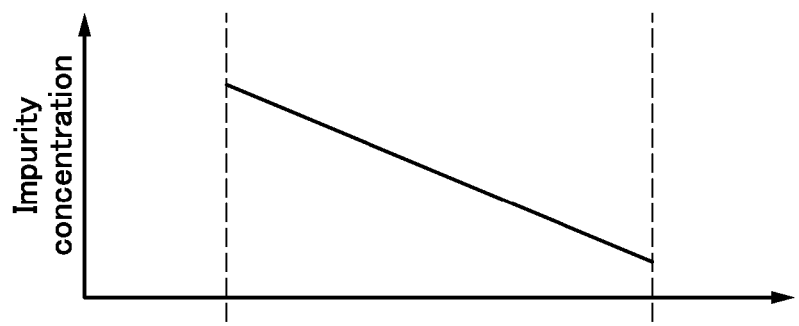
FIGS. 7A to 7C each show a concentration profile of impurities in a silicon semiconductor layer.
Figure 7B:
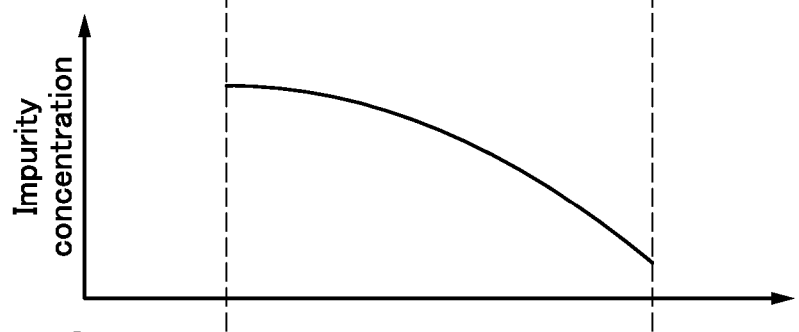
Figure 7C:
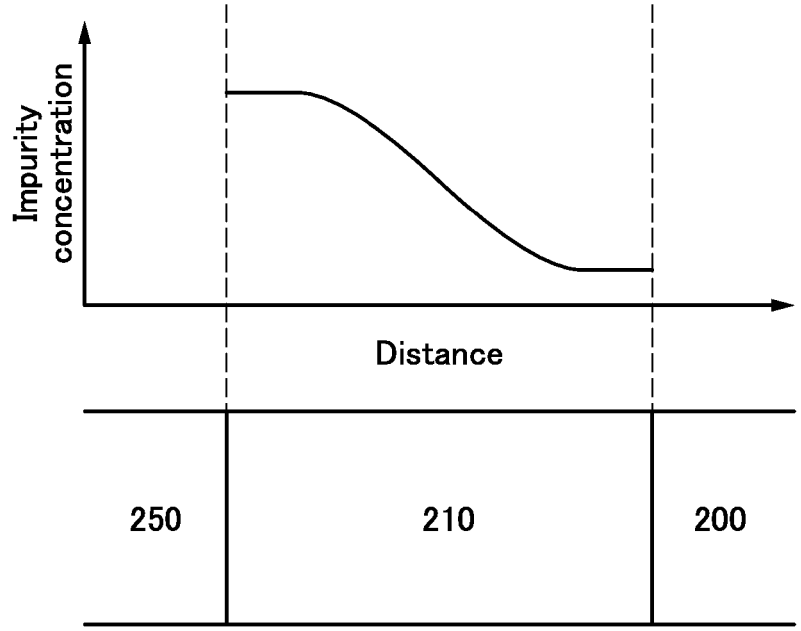

For example, the concentration profile of the impurities may be any of concentration profiles shown in FIGS. 7A to 7C. FIG. 7A shows a concentration profile in which the impurity concentration is changed linearly from the light-transmitting conductive film 250 side (hereinafter the upper side) to the crystalline silicon substrate 200 side (hereinafter the lower side). Further, FIG. 7B shows a concentration profile in which the impurity concentration is changed gradually from the upper side to the lower side. Furthermore, FIG. 7C shows a concentration profile including regions where the impurity concentration is constant on the upper side and the lower side, and a region where the impurity concentration is changed between the regions.

Note that the concentration profiles shown in FIGS. 7A to 7C are examples and the present invention is not limited thereto. Further, FIGS. 7A to 7C each show a relative concentration profile and do not show an absolute concentration profile. Furthermore, the concentration profile of the impurities may be a combination of some of the concentration profiles shown in FIGS. 7A to 7C. Further, the concentration profile of the impurities may have a peak value as long as the impurity concentration is higher on the upper side and is lower on the lower side in the concentration profile.

With the semiconductor layer having a concentration profile in which the impurity concentration is higher on the upper side and is lower on the lower side, which is described above, a single semiconductor layer can be substituted for the two semiconductor layers (the first silicon semiconductor layer 110 and the second silicon semiconductor layer 120), which are described in Embodiment 1. That is, it is possible to use the region where the impurity concentration is higher on the upper side for the $p^+$-type semiconductor layer described Embodiment 1 and to use the region where the impurity concentration is lower on the lower side for the $p^-$-type semiconductor layer described Embodiment 1.

That is, in the first silicon semiconductor layer 210 of the photoelectric conversion device in this embodiment, the $p^-$-type semiconductor region where the number of localized levels attributable to impurities is as small as possible is in contact with the crystalline silicon substrate 200, which acts to reduce defects on the surface of the crystalline silicon substrate, and the $p^+$-type semiconductor region acts to increase the diffusion potential.

Further, for the second silicon semiconductor layer 220 formed on the other surface of the crystalline silicon substrate 200, an n-type silicon semiconductor layer can be used. For example, a silicon semiconductor layer to which an impurity imparting n-type conductivity such as phosphorus, arsenic, or antimony and hydrogen are added can be used for the second silicon semiconductor layer 220.

Here, it can be said that the second silicon semiconductor layer 220 is an n-type semiconductor layer as a whole. However, the concentration profile of the impurities in the second silicon semiconductor layer 220 is changed in the film thickness direction and the second silicon semiconductor layer 220 has a concentration profile in which the impurity concentration is higher on the second electrode 290 side and is lower on the crystalline silicon substrate 200 side.

In other words, in the second silicon semiconductor layer 220, the carrier concentration is higher on the second electrode 290 side and is lower on the crystalline silicon substrate 200 side.

Figure 8A:
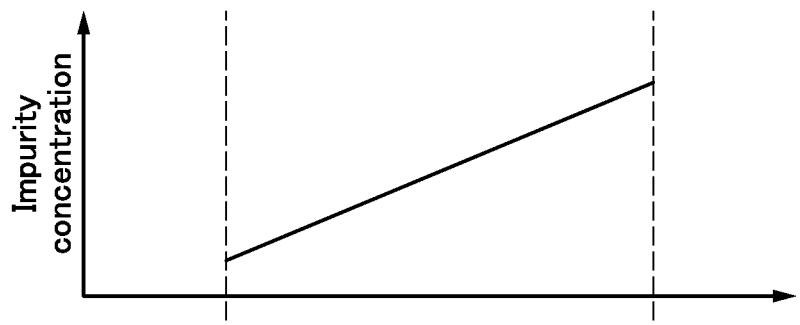
FIGS. 8A to 8C each show a concentration profile of impurities in a silicon semiconductor layer.
Figure 8B:
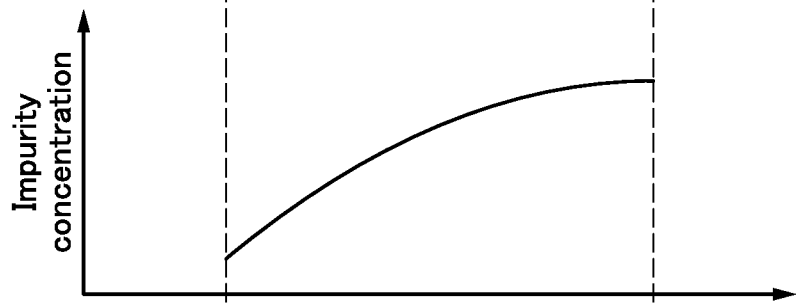
Figure 8C:
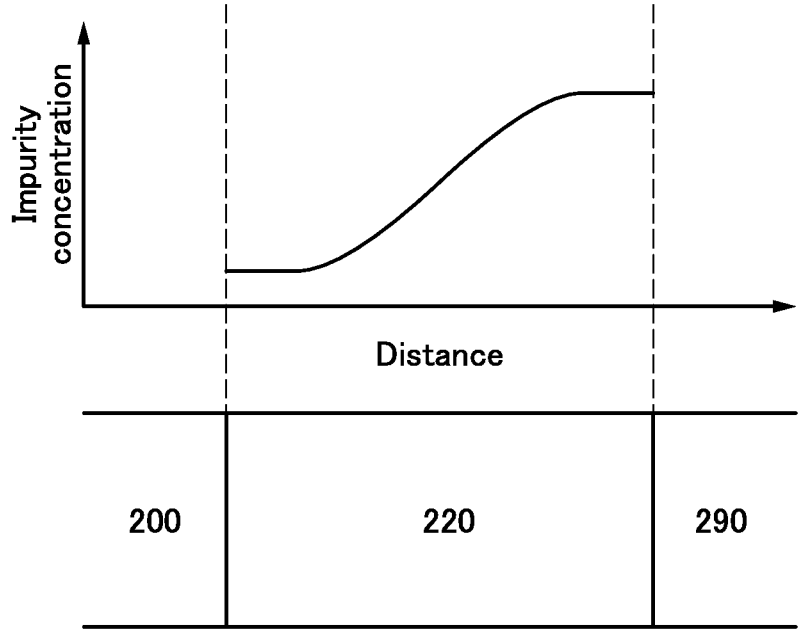

For example, the concentration profile of the impurities may be any of concentration profiles shown in FIGS. 8A to 8C. FIG. 8A shows a concentration profile in which the impurity concentration is changed linearly from the second electrode 290 side (hereinafter the upper side) to the crystalline silicon substrate 200 side (hereinafter the lower side). Further, FIG. 8B shows a concentration profile in which the impurity concentration is changed gradually from the upper side to the lower side. Furthermore, FIG. 8C shows a concentration profile including regions where the impurity concentration is constant on the upper side and the lower side, and a region where the impurity concentration is changed between the regions.

Note that the concentration profiles shown in FIGS. 8A to 8C are examples and the present invention is not limited thereto. Further, FIGS. 8A to 8C each show a relative concentration profile and do not show an absolute concentration profile. Furthermore, the concentration profile of the impurities may be a combination of some of the concentration profiles shown in FIGS. 8A to 8C. Further, the concentration profile of the impurities may have a peak value as long as the impurity concentration is higher on the upper side and is lower on the lower side in the concentration profile.

With the semiconductor layer having a concentration profile in which the impurity concentration is higher on the upper side and is lower on the lower side described above, a single semiconductor layer can be substituted for the two semiconductor layers (the third silicon semiconductor layer 130 and the fourth silicon semiconductor layer 140), which are described in Embodiment 1. That is, it is possible to use the region where the impurity concentration is higher on the upper side for the n$^+$-type semiconductor layer described Embodiment 1 and to use the region where the impurity concentration is lower on the lower side for the n$^-$-type semiconductor layer described Embodiment 1.

That is, in the second silicon semiconductor layer 220 of the photoelectric conversion device in this embodiment, the n$^-$-type semiconductor region where the number of localized levels attributable to impurities is as small as possible is in contact with the crystalline silicon substrate 200, which acts to reduce defects on the surface of the crystalline silicon substrate, and the n$^+$-type semiconductor region serves as a BSF layer.

Accordingly, it can be said that the photoelectric conversion device in this embodiment has substantially the same structure as the photoelectric conversion device in which a gentle junction described in Embodiment 1 is formed.

The photoelectric conversion device in this embodiment can be manufactured with reference to the method for manufacturing a photoelectric conversion device, which is described in Embodiment 1, except for the first silicon semiconductor layer 210 and the second silicon semiconductor layer 220.

The first silicon semiconductor layer 210 can be formed by a plasma CVD method and preferably has a thickness greater than or equal to 3 nm and less than or equal to 50 nm. In this embodiment, the first silicon semiconductor layer 210 is p-type amorphous silicon and has a thickness of 10 nm.

The first silicon semiconductor layer 210 can be formed, for example, under the following conditions: monosilane and hydrogen-based phosphine (0.5%) are introduced to a reaction chamber at a flow rate ratio of 1:0.3 to 1:15 while the ratio is changed with time; the pressure inside the reaction chamber is higher than or equal to 100 Pa and lower than or equal to 200 Pa; the electrode interval is greater than or equal to 8 mm and less than or equal to 40 mm; the power density based on the area of a cathode electrode is greater than or equal to 8 mW/cm$^2$ and less than or equal to 50 mW/cm$^2$; and the substrate temperature is greater than or equal to 150° C. and less than or equal to 300° C.

The second silicon semiconductor layer 220 can be formed by a plasma CVD method and preferably has a thickness greater than or equal to 3 nm and less than or equal to 50 nm. In this embodiment, the second silicon semiconductor layer 220 is n-type amorphous silicon and has a thickness of 5 nm.

The second silicon semiconductor layer 220 can be formed, for example, under the following conditions: monosilane and hydrogen-based diborane (0.1%) are introduced to a reaction chamber at a flow rate ratio of 1:0.01 to 1:20 while the ratio is changed with time; the pressure inside the reaction chamber is higher than or equal to 100 Pa and lower than or equal to 200 Pa; the distance between electrodes is greater than or equal to 10 mm and less than or equal to 40 mm; the power density based on the area of a cathode electrode is greater than or equal to 8 mW/cm$^2$ and less than or equal to 120 mW/cm$^2$; and the substrate temperature is higher than or equal to 150° C. and lower than or equal to 300° C.

In this manner, the first silicon semiconductor layer 210 and the second silicon semiconductor layer 220 are formed, whereby the photoelectric conversion device with low resistance loss according to one embodiment of the present invention can be manufactured.

This embodiment can be freely combined with any of other embodiments.

EXAMPLE 1

In this example, comparison evaluation results of lifetimes for studying a passivation effect of various p-type and n-type silicon semiconductor layers are described.

Figure 9:
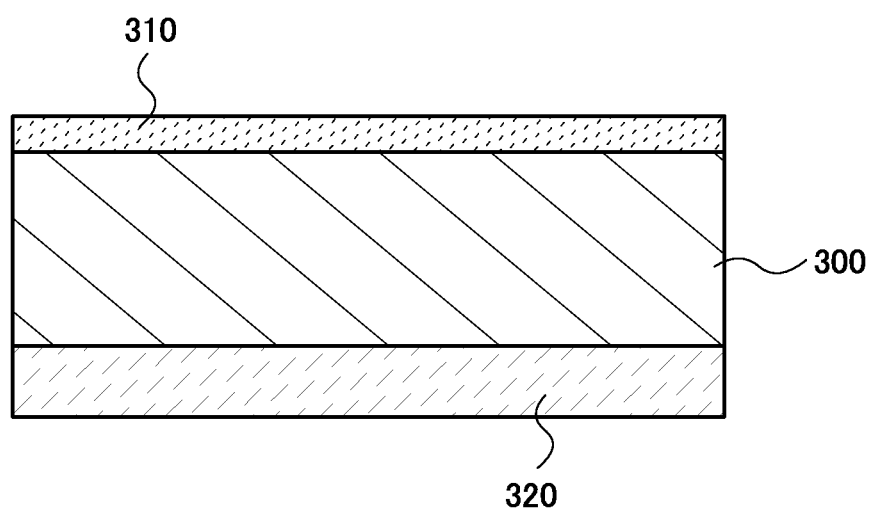
FIG. 9 illustrates a sample for measurement of a lifetime.

FIG. 9 is a cross-sectional view of a sample for measurement of the lifetime. As a substrate 300, an n-type single crystal silicon substrate (with a diameter of 2 inches, a thickness of 300 μm, and a resistivity of 1000 Ω·cm or higher) formed by an FZ method was used. Further, as a first passivation layer 310, any one of an i-type silicon semiconductor layer, a p-type silicon semiconductor layer, or an n-type silicon semiconductor layer was used. In addition, the thickness was 5 nm. Furthermore, as a second passivation layer 320, an i-type silicon semiconductor layer was used and the thickness was 15 nm. Note that a plurality of samples was manufactured so as to obtain a different electrical conductivity.

Any p-type silicon semiconductor layer was formed by a manufacturing method similar to that in Embodiment 1. In the formation of the layer, the flow rate ratio of monosilane and diborane was changed so that the ratio of boron atoms to silicon atoms (B/Si) in a source gas is in the range of 0 to 0.003.

Further, any n-type silicon semiconductor layer was formed by a manufacturing method similar to that in Embodiment 1. In the formation of the layer, the flow rate ratio of monosilane and phosphine was changed so that the ratio of phosphorus atoms to silicon atoms (P/Si) in a source gas is in the range of 0 to 0.07.

Furthermore, the lifetime was measured by a microwave photoconductive decay method (μ-PCD method) using a lifetime measurement system manufactured by Semilab Co. Ltd. (product name: WT-2000). Note that for the measurement, mapping measurement was performed in-plane of the substrate 300 at a pitch of 2 mm (at 564 points in total) and an average value thereof was used in the result.

Figure 10:
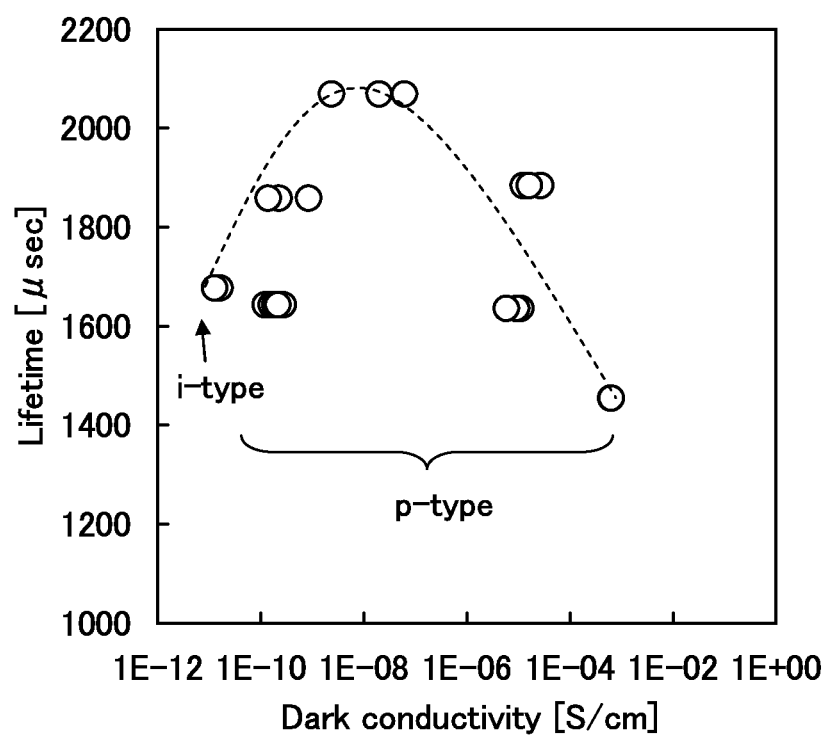
FIG. 10 illustrates each relation between the dark conductivity and the lifetime of samples including an i-type or a p-type passivation layer.

FIG. 10 is a graph illustrating each relation between the dark conductivity and the lifetime of the samples in which the i-type or the p-type silicon semiconductor layer is used as the first passivation layer 310. It can be seen that the lifetime of the p-type sample is higher than that of the i-type sample and that the lifetime of the p-type sample having relatively low dark conductivity is high. That is, it can be said that the p$^-$-type silicon semiconductor layer is more suitable than the i-type silicon semiconductor layer for a passivation layer formed on a surface of a crystalline silicon substrate, and the dark conductivity is in the range greater than or equal to $1\times10^{-10}$ S/cm and less than or equal to $1\times10^{-5}$ S/cm, preferably greater than or equal to $1\times10^{-9}$ S/cm and less than or equal to $1\times10^{-6}$ S/cm, more preferably greater than or equal to $1\times10^{-9}$ S/cm and less than or equal to $1\times10^{-7}$ S/cm.

Figure 11:
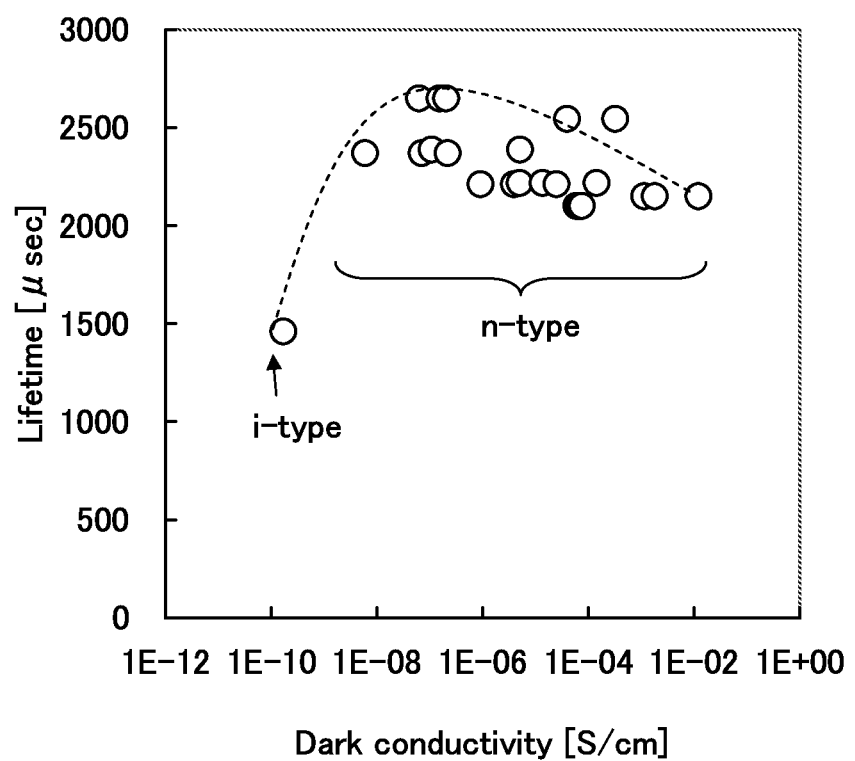
FIG. 11 illustrates each relation between the dark conductivity and the lifetime of samples including an i-type or an n-type passivation layer.

Further, FIG. 11 is a graph illustrating each relation between the dark conductivity and the lifetime of the samples in which the i-type or the n-type silicon semiconductor layer is used as the first passivation layer 310. It can be seen that the lifetime of the n-type sample having relatively high dark conductivity is higher than that of the i-type sample. That is, it can be said that the n$^-$-type silicon semiconductor layer is more suitable than the i-type silicon semiconductor layer for a passivation layer formed on a surface of a crystalline silicon substrate, and the dark conductivity is in the range greater than or equal to $1\times10^{-10}$ S/cm and less than or equal to $1\times10^{-5}$ S/cm, preferably greater than or equal to $1\times10^{-9}$ S/cm and less than or equal to $1\times10^{-6}$ S/cm, more preferably greater than or equal to $1\times10^{-9}$ S/cm and less than or equal to $1\times10^{-7}$ S/cm.

The above results reveals that the silicon semiconductor layer having p$^-$-type or n$^-$-type conductivity is more suitable than the silicon semiconductor layer having i-type conductivity for a passivation layer formed on a surface of a crystalline silicon substrate.

This example can be freely combined with any of the embodiments.

This application is based on Japanese Patent Application serial no. 2011-216412 filed with Japan Patent Office on Sep. 30, 2011, the entire contents of which are hereby incorporated by reference.

What is claimed is:

1. A photoelectric conversion device comprising:
   a first electrode;
   a second electrode;
   a crystalline silicon substrate having one conductivity type between the first electrode and the second electrode;
   a first silicon semiconductor layer between the crystalline silicon substrate and the first electrode, the first silicon semiconductor layer having a conductivity type opposite to that of the crystalline silicon substrate;
   a light-transmitting conductive film between the first silicon semiconductor layer and the first electrode; and
   a second silicon semiconductor layer between the crystalline silicon substrate and the second electrode, the second silicon semiconductor layer having the same conductivity type as the crystalline silicon substrate,
   wherein the first silicon semiconductor layer comprises a first region, a second region under the first region, and a third region under the second region,
   wherein the first silicon semiconductor layer comprises an impurity element imparting a conductivity type,
   wherein a concentration of the impurity element is constant in the third region,
   wherein a concentration of the impurity element in the second region monotonically increases in a film thickness direction from a third region side to a first region side,
   wherein a concentration of the impurity element is constant in the first region, and
   wherein the second silicon semiconductor layer is in contact with the second electrode.

2. The photoelectric conversion device according to claim 1,
   wherein the crystalline silicon substrate has n-type conductivity, the first silicon semiconductor layer has p-type conductivity, and the second silicon semiconductor layer has n-type conductivity.

3. The photoelectric conversion device according to claim 1,
   wherein the crystalline silicon substrate is a single-crystal silicon substrate.

4. A photoelectric conversion device comprising:
   a first electrode;
   a second electrode;
   a crystalline silicon substrate having one conductivity type between the first electrode and the second electrode;
   a first silicon semiconductor layer having a conductivity type opposite to that of the crystalline silicon substrate between the crystalline silicon substrate and the first electrode;
   a light-transmitting conductive film between the first silicon semiconductor layer and the first electrode; and
   a second silicon semiconductor layer having the same conductivity type as the crystalline silicon substrate between the crystalline silicon substrate and the second electrode,
   wherein the second silicon semiconductor layer comprises a first region, a second region over the first region, and a third region over the second region,
   wherein the second silicon semiconductor layer comprises an impurity element imparting a conductivity type,
   wherein a concentration of the impurity element is constant in the third region,
   wherein a concentration of the impurity element in the second region monotonically increases in a film thickness direction from a third region side to a first region side,
   wherein a concentration of the impurity element is constant in the first region, and
   wherein the second silicon semiconductor layer is in contact with the second electrode.

5. The photoelectric conversion device according to claim 4,
   wherein the crystalline silicon substrate has n-type conductivity, the first silicon semiconductor layer has p-type conductivity, and the second silicon semiconductor layer has n-type conductivity.

6. The photoelectric conversion device according to claim 4,
   wherein a dark conductivity of the first silicon semiconductor layer is greater than or equal to $1\times10^{-10}$ S/cm and less than or equal to $1\times10^{-5}$ S/cm.

7. The photoelectric conversion device according to claim 4,
wherein a dark conductivity of the second silicon semiconductor layer is greater than or equal to $1\times10^{-9}$ S/cm and less than or equal to $1\times10^{-4}$ S/cm.

8. The photoelectric conversion device according to claim 4,
wherein the crystalline silicon substrate is a single-crystal silicon substrate.

9. A photoelectric conversion device comprising:
a first electrode;
a second electrode;
a crystalline silicon substrate having one conductivity type between the first electrode and the second electrode;
a first silicon semiconductor layer having a conductivity type opposite to that of the crystalline silicon substrate between the crystalline silicon substrate and the first electrode;
a light-transmitting conductive film between the first silicon semiconductor layer and the first electrode; and
a second silicon semiconductor layer having the same conductivity type as the crystalline silicon substrate between the crystalline silicon substrate and the second electrode,
wherein the first silicon semiconductor layer comprises a first region, a second region under the first region, and a third region under the second region,
wherein the first silicon semiconductor layer comprises a first impurity element imparting a conductivity type,
wherein a concentration of the first impurity element is constant in the third region,
wherein a concentration of the first impurity element in the second region monotonically increases in a film thickness direction from a third region side to a first region side,
wherein a concentration of the first impurity element is constant in the first region
wherein the second silicon semiconductor layer comprises a fourth region, a fifth region over the fourth region, and a sixth region over the fifth region,
wherein the second silicon semiconductor layer comprises a second impurity element imparting a conductivity type,
wherein a concentration of the second impurity element is constant in the sixth region,
wherein a concentration of the second impurity element in the second region monotonically increases in a film thickness direction from a sixth region side to a fourth region side,
wherein a concentration of the second impurity element is constant in the fourth region, and
wherein the second silicon semiconductor layer is in contact with the second electrode.

10. The photoelectric conversion device according to claim 9,
wherein the first region of the first silicon semiconductor layer is in contact with the light-transmitting conductive film, and
wherein the third region of the first silicon semiconductor layer is in contact with the crystalline silicon substrate.

11. The photoelectric conversion device according to claim 10,
wherein the fourth region of the second silicon semiconductor layer is in contact with the second electrode, and
wherein the sixth region of the second silicon semiconductor layer is in contact with the crystalline silicon substrate.

12. The photoelectric conversion device according to claim 9,
wherein the fourth region of the second silicon semiconductor layer is in contact with the second electrode, and
wherein the sixth region of the second silicon semiconductor layer is in contact with the crystalline silicon substrate.

13. The photoelectric conversion device according to claim 9,
wherein the crystalline silicon substrate has n-type conductivity, the first silicon semiconductor layer has p-type conductivity, and the second silicon semiconductor layer has n-type conductivity.

14. The photoelectric conversion device according to claim 9, wherein the crystalline silicon substrate is a single-crystal silicon substrate.

* * * * *